United States Patent [19]

Kaida et al.

[11] Patent Number: 5,017,864
[45] Date of Patent: May 21, 1991

[54] APPARATUS FOR THE INSPECTION OF PRINTED CIRCUIT BOARDS ON WHICH COMPONENTS HAVE BEEN MOUNTED

[75] Inventors: Kenichi Kaida; Osamu Yamada; Eiji Okuda, all of Ehime, Japan

[73] Assignee: Matsushita Electric Industrial Co., Ltd., Osaka, Japan

[21] Appl. No.: 369,160

[22] Filed: Jun. 21, 1989

[30] Foreign Application Priority Data

Jun. 22, 1988 [JP] Japan .................. 63-153919
Jun. 22, 1988 [JP] Japan .................. 63-153920
Jun. 22, 1988 [JP] Japan .................. 63-153921
Jun. 22, 1988 [JP] Japan .................. 63-153959

[51] Int. Cl.⁵ .................. G01R 31/02; G01P 3/42
[52] U.S. Cl. .................. 324/158 F; 324/158 R; 356/4
[58] Field of Search .................. 324/158 F, 158 R; 356/2, 3, 4, 5; 382/66; 358/494, 495, 496

[56] References Cited

U.S. PATENT DOCUMENTS 4,636,068 1/1987 Niiho et al. .................. 356/5
4,671,650 6/1987 Hirzel et al. .................. 356/4

Primary Examiner—Ernest F. Karlsen
Attorney, Agent, or Firm—Panitch Schwarze Jacobs & Nadel

[57] ABSTRACT

An inspection apparatus for inspecting printed circuit boards on which components have been mounted, wherein a light source that generates a light beam in a concentrated spot fashion is mounted on a rotary object and radiates the beam spot onto the printed circuit board at approximately right angles thereto while the rotary object is rotating, so that the surface of the printed circuit board is scanned by the beam spot. Changes of at least either one of the reflection angle and the intensity of the light reflected from the printed circuit board is detected by photoelectric converters provided on the rotary object, and at least either one of the height and the brightness of the position at which the beam spot and the printed circuit board are intersected is measured, thereby performing the inspection of the printed circuit board.

4 Claims, 6 Drawing Sheets

APPARATUS FOR THE INSPECTION OF PRINTED CIRCUIT BOARDS ON WHICH COMPONENTS HAVE BEEN MOUNTED

BACKGROUND OF THE INVENTION

1. Field of the Invention

This invention relates to an apparatus for the inspection of printed circuits on which components have been mounted. More particularly, it relates to an apparatus that inspects for a dislocation of components mounted on a printed circuit board, an unsatisfactory soldering of the components, solder bridges of the components, or the like by the use of narrow beam spots.

2. Description of the Prior Art

Conventional methods for automatically inspecting for a dislocation of components mounted on printed circuit boards, an unsatisfactory soldering of the components and solder bridges of the components, or the like include a method that uses light beams from light emitting devices through multi-slit and a camera. FIG. 1 shows a model of the inspection apparatus for finding inspection of the dislocation of components mounted on a printed circuit board, or the like by this method. Two light beams from multi-slit-type light radiating devices 55 and 56 obliquely are radiated onto a printed circuit board 57 on which components have been mounted so that their optical axes intersect at right angles. Through observation with a camera 54 located above, the height of each of the mounted components can be measured based on the principles of triangulation. The position of each component in the directions of x and y (refer to FIG. 4) can also be determined by radiating beams from the multi-slit-type light radiating devices 55 and 56.

However, the constitution as described above is disadvantageous for the following reasons. In an inspection of solder surfaces of the components, because the reflection and scattering characteristics of the solder surface are similar to those of a mirror, light reflected from the solder surfaces becomes excessively strong or weak depending on a relationship between the inclination of the solder surface and the position of the camera, so that the camera cannot function as a sensor. Moreover, cameras have limitations to their fields of view, and it happens that only a part of the components to be inspected can be covered by the field of view of the cameras. In this case, image information from multiple fields of view is required to inspect a single component, which makes the inspection software thereof complicated.

SUMMARY OF THE INVENTION

The inspection apparatus of this invention, which overcomes the above-discussed and numerous other disadvantages and deficiencies of the prior art, is an inspection apparatus for inspecting printed circuit boards on which components have been mounted, wherein a light source that generates a light beam in a concentrated spot fashion is mounted on a rotary object and radiates the beam spot onto the printed circuit board at approximately right angles thereto while the rotary object is rotating, so that the surface of the printed circuit board is scanned by the beam spot. Changes of at least either one of the reflection angle and the intensity of the light reflected from the printed circuit board is detected by photoelectric converters provided on the rotary object, and at least either one of the height and the brightness of the position at which the beam spot and the printed circuit board are intersected is measured, thereby performing the inspection of the printed circuit board.

Thus, the invention described herein makes possible the objectives of (1) providing an inspection apparatus for inspecting printed circuit boards on which components have been mounted, in which because the printed circuit board is scanned by a beam spot that is incident to the printed circuit board at approximately right angles, every point of the surface of the printed circuit board is measured under the same conditions, enabling accurate inspection; (2) providing an inspection apparatus in which even if the scattering characteristics of the light reflected from the printed circuit board change, variation in the inspection caused by the change can be minimized because of a plurality of photoelectric converters that receive the reflected light are arranged around the light beam; and (3) providing an inspection apparatus in which if the height and brightness data for a printed circuit board is stored in a memory, identical components can be handled with the same inspection software, making it easy to develop the inspection software.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
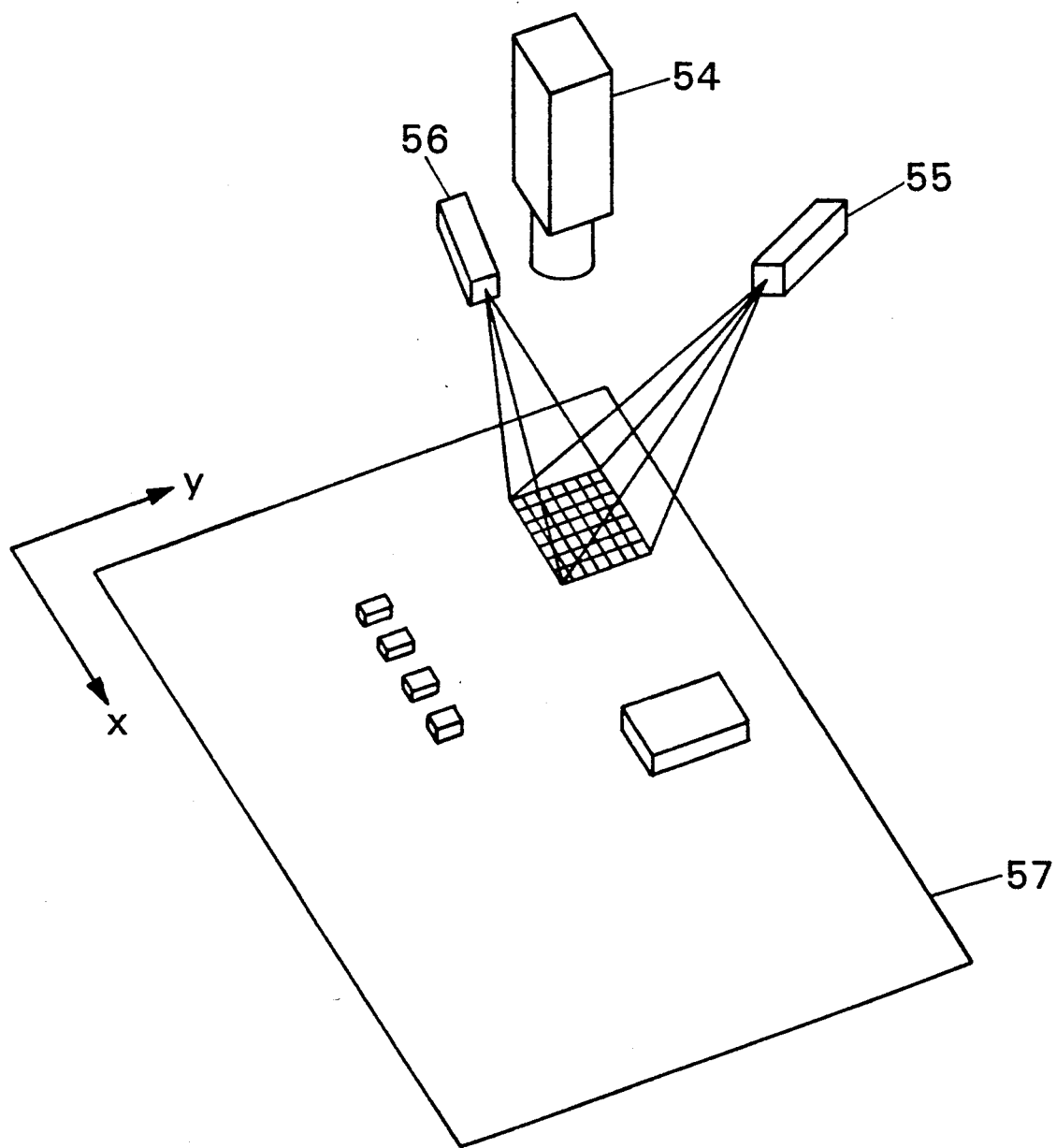
FIG. 1 is a perspective view showing a conventional apparatus for inspecting printed circuit boards on which components are mounted.
Figure 2:
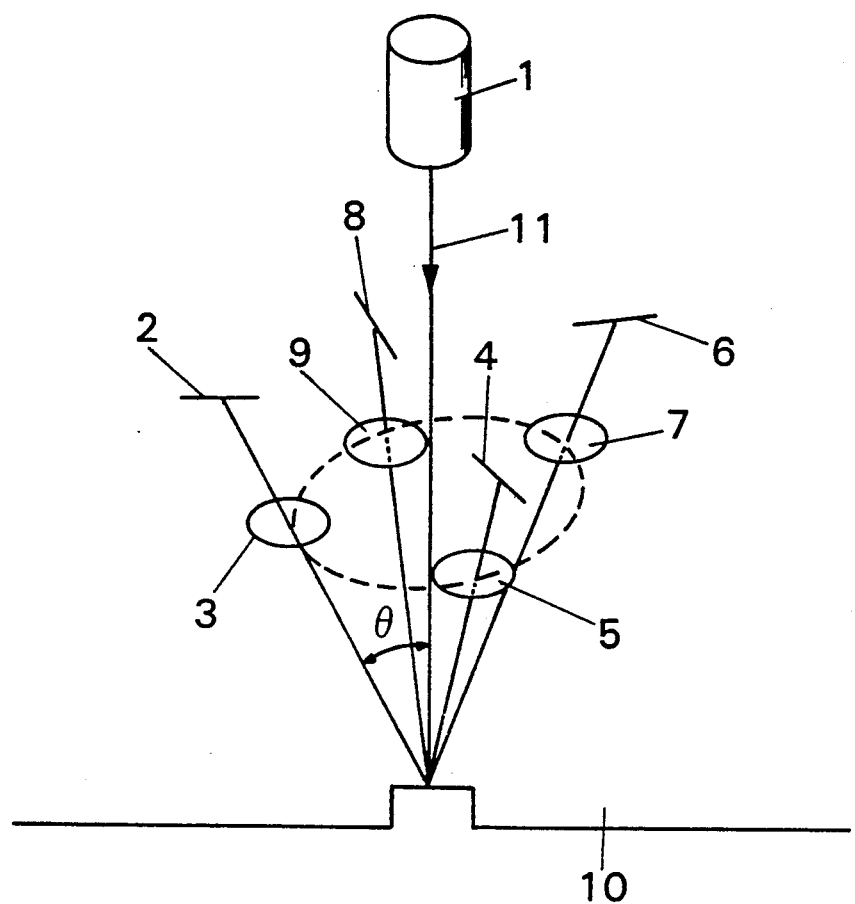
FIG. 2 is a perspective view showing an inspection unit that constitutes an inspection apparatus of this invention for inspecting printed circuit boards on which components are mounted.

FIG. 2 shows an inspection unit that constitutes an inspection apparatus of this invention. This inspection unit comprises an optical system 1 for radiating a beam spot 11 at approximately right angles onto a printed circuit board 10 with components mounted thereon and photoelectric converters 2, 4, 6 and 8 such as semiconductor position-sensitive devices (called PSDs hereinafter) that receive light reflected from the board 10 so as to give information on the height and the brightness of the portion of the board 10 from which the beam spot is reflected.

These PSDs have a specified length and delivers, from a plurality of output terminals, output signals which change relative to each other depending upon the position that is irradiated with the beam spot. CCD line sensors or the like can be used for the PSDs. The inspection apparatus further comprises lenses or groups of lenses 3, 5, 7 and 9 which focus the light reflected from the board 10 onto the photoelectric converters 2, 4, 6 and 8 so as to carry out triangulation. These photoelectric converters and lenses are arranged around the optical axis of the beam spot 11. In this embodiment, four sets of the photoelectric converter and lens are located at equal intervals on a circle which has its center on the optical axis of the beam spot.

A light beam of smaller cross section results in better accuracy in measurement of degrees of unevenness of the surface of the board. Since the heights of components to be measured are largely within 2 mm, average measuring accuracy can be optimized by focusing the light beam at a height of 1 mm above the surface of the board 10.

Figure 3:
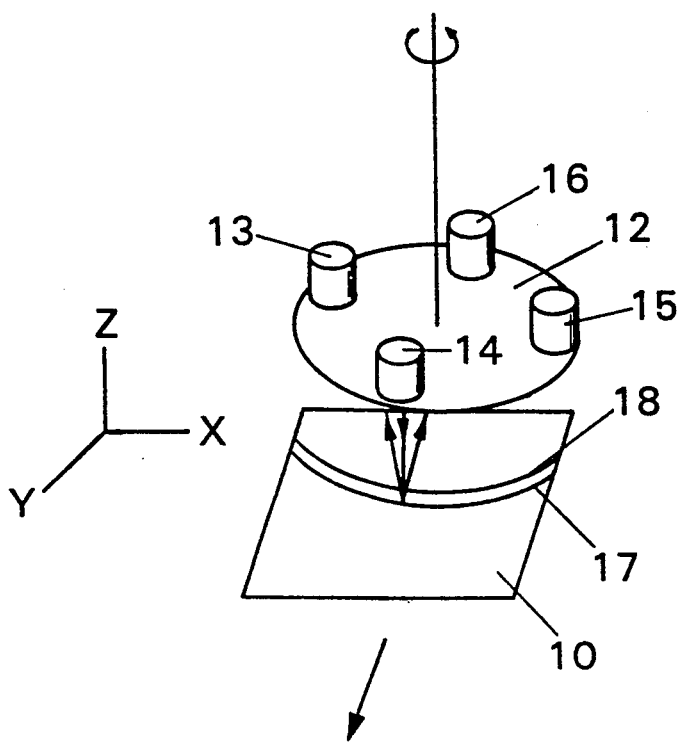
FIG. 3 is a perspective view showing an inspection apparatus of this invention.

FIG. 3 shows an inspection apparatus of this invention that is composed of a plurality of inspection units 13, 14, 15 and 16 with the same structure as that shown in FIG. 2. The inspection units 13, 14, 15 and 16 are arranged at equal intervals on a circle which is coaxial with a rotary disk 12, which rotates at an approximately constant speed while being driven by a driving means (not shown) such as a motor, so that the beam scans the board 10 as the rotary disk 12 rotates. Consequently the entire surface of the board 10 can be scanned with the beam spot by moving the board 10 in the y direction of the x-y-z coordinate system as shown in FIG. 3. The reference numeral 17 denotes a path currently scanned by the inspection unit 14 and the reference numeral 18 denotes a path which has just before been scanned by the inspection unit 16. In FIG. 2, the board 10 moves in the y direction upon completion of the scanning by the inspection unit 14, and stops before the next inspection unit 13 starts scanning, so that the inspection can be completed in the shortest period of time.

Figure 4:
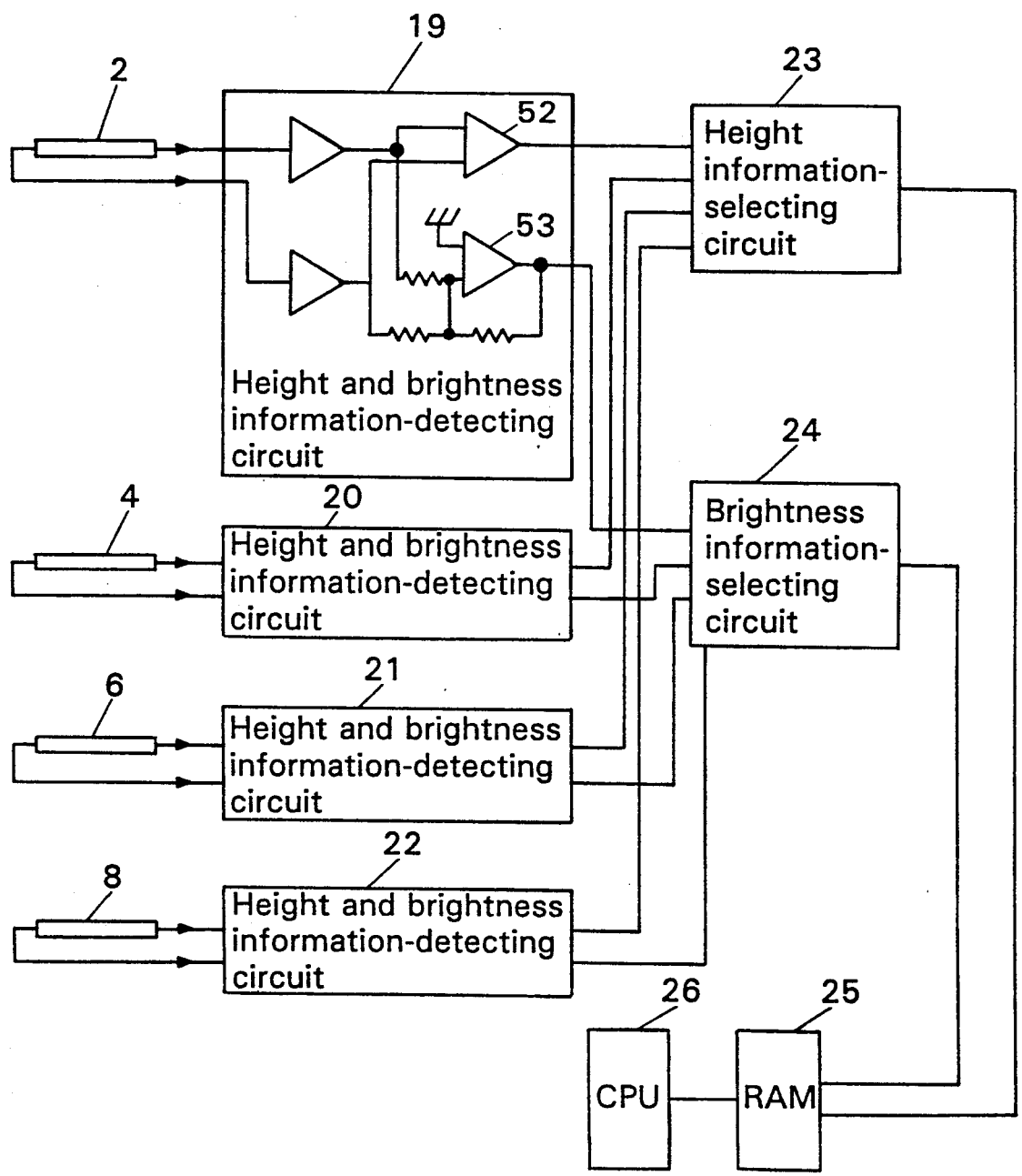
FIG. 4 is a block diagram showing an electric circuit of the inspection apparatus shown in FIG. 3.

FIG. 4 shows an electric circuit of the inspection apparatus of this invention by which two current outputs from the photoelectric converters that relatively change depending upon the position that is irradiated with the beam are operated so as to obtain the height and brightness information. The reference numeral 19 is a height & brightness information-detecting circuit which acquires the height information from the two current outputs of the photoelectric converter 2 via a divider 52 and the brightness information from the sum of two current outputs via an operational amplifier 53. The reference numerals 20, 21 and 22 are detector circuits similar to the height & brightness information-detecting circuit 19, which are connected to the photoelectric converters 4, 6 and 8, respectively. Because four photoelectric converters are used, four sets of height and brightness information are output for each beam. The reference numeral 23 is a height information-selecting circuit which obtains one set of height information from the four sets of height information available. Selection of the information can be done by averaging the medium two values discarding the maximum and minimum values, for example. The reference numeral 24 is a brightness information selecting circuit which obtains one set of brightness information from the four sets of brightness information available. Selection of the information can be done by taking the largest value among the four. The selecting circuits 23 and 24 are provided in order to reduce the capacity of RAM 25 and the load on CPU 26 by pre-processing the data. Outputs of the two selecting circuits 23 and 24 are sent to the RAM 25 which is connected to a bus of the CPU 26. The CPU 26 compares the height and brightness information read from the RAM 25 with the height information and the brightness information from a reference standard printed circuit board with components mounted thereon, which have been stored in advance, thereby making decisions on whether the printed circuit board under inspection is to be accepted or not.

As described above, in this embodiment, light beams are radiated onto a printed circuit board with components at right angles and the height and brightness at every point of the board are measured while moving the beam together with the photoelectric converters arranged around the beam. Thus, all points of the board can be measured under the same conditions, resulting in accurate inspection.

Moreover, the inspection apparatus is so constructed that the light reflected by the board is received by a plurality of photoelectric converters arranged around the light beam, and thus, even if the scattering characteristics of the reflected light from the board change, variation in the inspection results caused by the said change can be minimized. Although the inspection apparatus of this embodiment is constructed so that both height and brightness of each point of the board surface are detected, the apparatus may be made of such a construction that detects only one of the two kinds of information if the inspection accuracy can be compromised.

Figure 5:
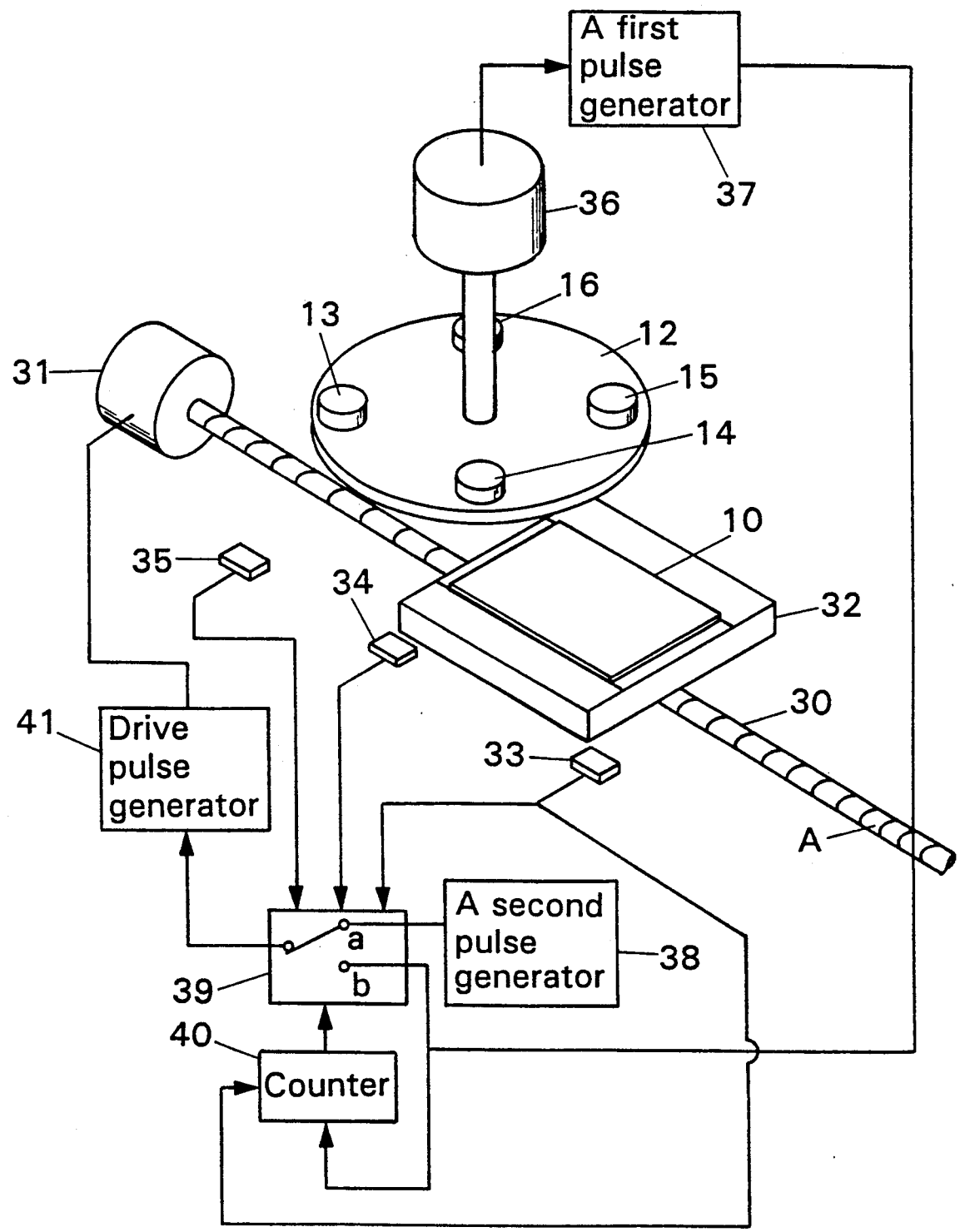
FIG. 5 is a schematic diagram showing a printed circuit board conveyer used in this invention.

FIG. 5 shows a printed circuit board conveyer in which a table 32 on which a printed circuit board 10 with components mounted thereon is disposed is engaged with a conveyance screw 30 and is moved in accordance with the rotation of the conveyance screw 30. The conveyance screw 30 is reversibly rotated by a pulse motor 31. First, second and third detectors 33, 34 and 35 detect the positioning of the printed circuit board table 32 at the 1st, 2nd and 3rd positions, respectively. The reference numeral 36 is a rotation angle detector which generates a pulse signal every time the afore-mentioned rotary disk 12 rotates by a predetermined small angle. The reference numeral 37 is a 1st pulse generator which counts the output pulse from the rotation angle detector 36 and generates a drive pulse every time the count reaches a preset number. The reference numeral 38 is a 2nd pulse generator which generates pulses of a specified frequency, the output of which and the output of the 1st pulse generator 37 are applied to contacts a and b of a switching circuit 39, respectively. The reference numeral 40 is a counter which is reset by the output of the 1st detector 33 and counts the output pulses of the 1st pulse generator 37 and, when the count reaches a predetermined number, it generates an output signal. The switching circuit 39 is driven by the outputs from the 1st, 2nd and 3rd detectors 33, 34 and 35 and the counter 40, and drives the pulse motor 31 with its output via the drive pulse generator 41. Operation of this conveyer is as follows:

First, the printed circuit board table 32 is positioned at a point A at the end of the conveyance screw 30 and a printed circuit board 10 to be inspected on which components are mounted is placed on the table 32. When a contact piece of the switching circuit 39 is connected to the contact a in this state, the pulse motor 31 is driven by the output of the 2nd pulse generator 38 so that the table 32 is driven at high speed. When the 1st detector 33 detects the table 32, its output makes the switching circuit 39 switch to the contact b to cause the pulse motor 31 to run at low speed in synchronization with the rotation angle of the rotary disk 12 by the output from the 1st pulse generator 37. In other words, the printed circuit board 10 is driven in synchronization with the scanning of the light beam. When the printed circuit board table 32 reaches the 2nd position, the 2nd detector 34 is actuated to switch the switching circuit 39 to the side of the output of the 2nd pulse generator 38 once again, so that the table 32 is moved at high speed to the dismounting position of the board 10. The 3rd detector 35 detects that the table 32 has been moved to the dismounting position of the board 10 and causes the drive pulse generator 41 to rotate the pulse motor 31 at high speed in the reverse direction, so that the table 32 returns to the starting position where another printed circuit board is placed thereon.

When a specified number is reached, the counter 40 gives an output which causes the switching circuit 39 to switch to the contact a. The number mentioned above is set to a value that corresponds to a period of time from the time when the scanning of the printed circuit board is started, namely when the 1st detector 33 detects the printed circuit board table 32, to the time when a RAM which stores the detected information overflows.

The use of the selecting switch described above enables two kinds of movement to be performed, a movement which is synchronized with the rotation of the rotary disk and a movement without synchronization, with one set of a printed circuit board conveyer and a drive pulse motor. During the synchronized movement, the printed circuit board is moved accurately by the printed circuit board conveyer in synchronization with the rotation angle of the rotary disk 12, so that the position of a point to be scanned on the printed circuit board can be determined accurately.

Figure 6:
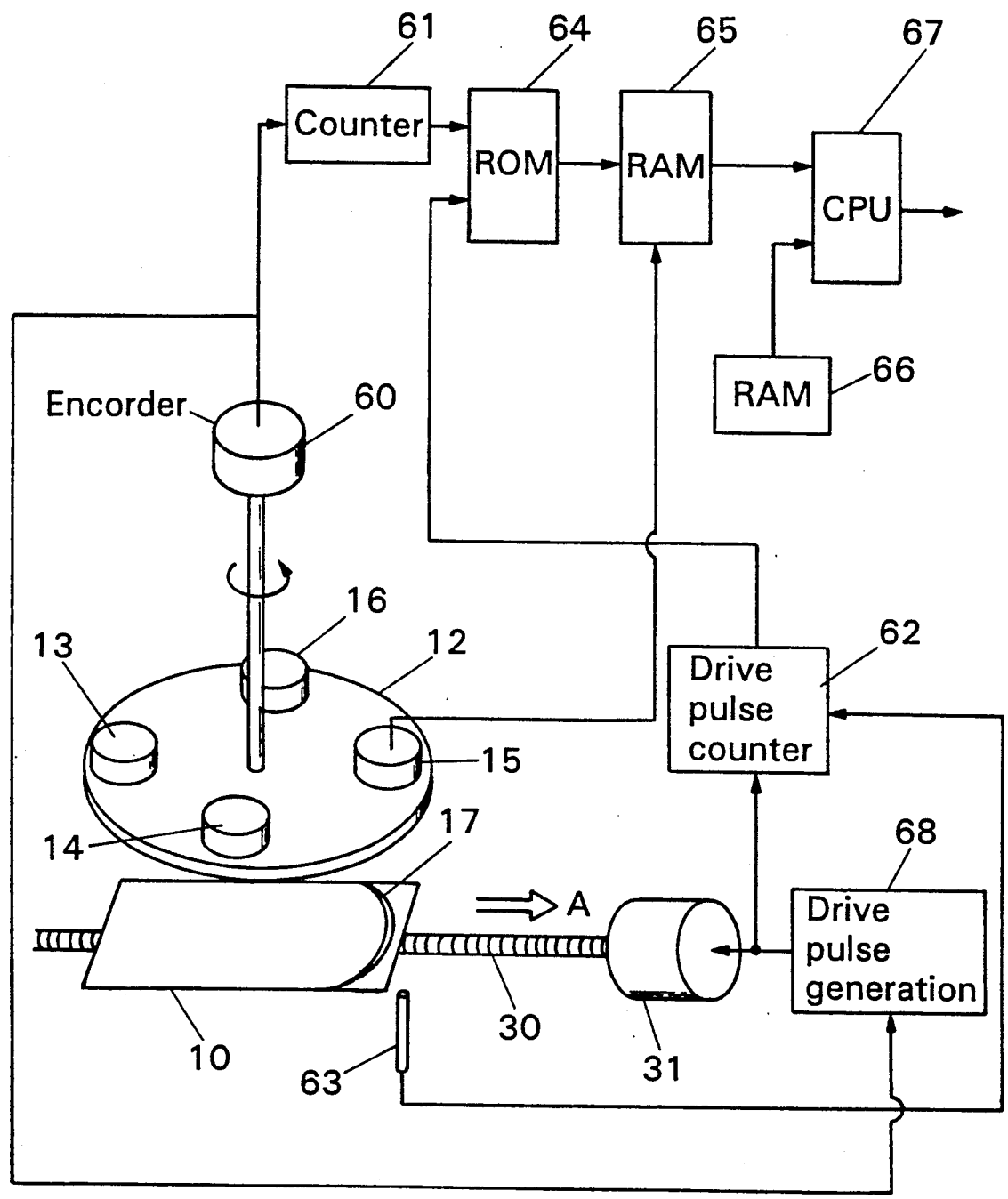
FIG. 6 is a schematic diagram showing another printed circuit board conveyer used in this invention.

FIG. 6 shows the printed circuit board conveyer and the sensor rotation mechanism. The inspection unit 15 is placed on the rotary disk 12 to scan along an arc path. An encoder 60 is mounted on the rotary disk 12 to obtain rotation angle information. The rotation angle information is obtained by the counter 61 that counts the output pulses from the encoder 60. A pulse motor 31 of the printed circuit board conveyer conveys the printed circuit board 10 in the direction indicated by the arrow A in synchronization with the rotation of the rotary disk 12. A drive pulse counter 62 is provided to count the drive pulses applied to the pulse motor 31, and is reset by a sensor 63 when the printed circuit board 10 moves to a predetermined position. The count of the drive pulse counter 62 gives information on the distance traveled by the printed circuit board 10. From both the rotation angle information and the travel distance information mentioned above, height and brightness information of a point on the printed circuit board 10 in a polar coordinate system is obtained. When storing the height and brightness information represented in the polar coordinate system in the RAM, because the same component is seen in a different shape depending upon its position in the printed circuit board where the component is mounted, unlike in the case of ordinary observation with the human eyes, problems arise such as the same inspection algorithm cannot be used in the inspection of the same component, resulting in a considerable decrease of the data processing efficiency. Therefore, the data obtained are converted from a polar coordinate system to a rectangular coordinate system, so that information processing can be done more efficiently. In this embodiment, a ROM 64 in which the addresses in the rectangular coordinate system corresponding to those in the polar coordinate system are stored in advance is used for the conversion section. The output of the ROM 64 that is converted to the rectangular coordinate system is made to correspond to the address of the RAM 65 that stores the height and brightness information, and the detection information that corresponds to the said address is successively stored. The detection information stored in the RAM 65 and reference data stored in a RAM 66 in advance are compared by a CPU 67 so that the inspection of the printed circuit board 10 on which components have been mounted can be carried out.

A pair of RAMs 65 for storing the detected information are provided, one of which stores the information of the board currently inspected, and reads out the information of the board, which has been inspected and stored immediately before, from another RAM, to compare it with the reference data and to carry out data processing. Every time the board to be inspected is changed, the functions of the two RAMs are exchanged and the data processing operations mentioned above are carried out, thus enabling high efficiency through such parallel processing.

Moreover, in this embodiment, in order to carry out the inspection of the board with high accuracy, the drive pulse generator 68 is controlled by the output of the encoder 60 so that the board travels a predetermined distance for every one fourth of a turn of the rotary disk 12, and the rotation of the pulse motor 31 is synchronized with the movement of the board. If high accuracy is not required for the inspection of the board, the rotation of the pulse motor 31 is not necessarily synchronized with that of the rotary disk 12.

As mentioned above, the inspection apparatus of this invention is constructed so that height and brightness data of a printed circuit board with components, which is scanned in arc paths thereon by the rotary object on which the light beam-radiating and -receiving optical systems are disposed and the printed circuit board conveyer, are converted to a rectangular coordinate system and then stored in RAMs. This construction makes the succeeding data processing operation easier than is the case where the data is stored as a polar coordinate representation.

Figure 7:
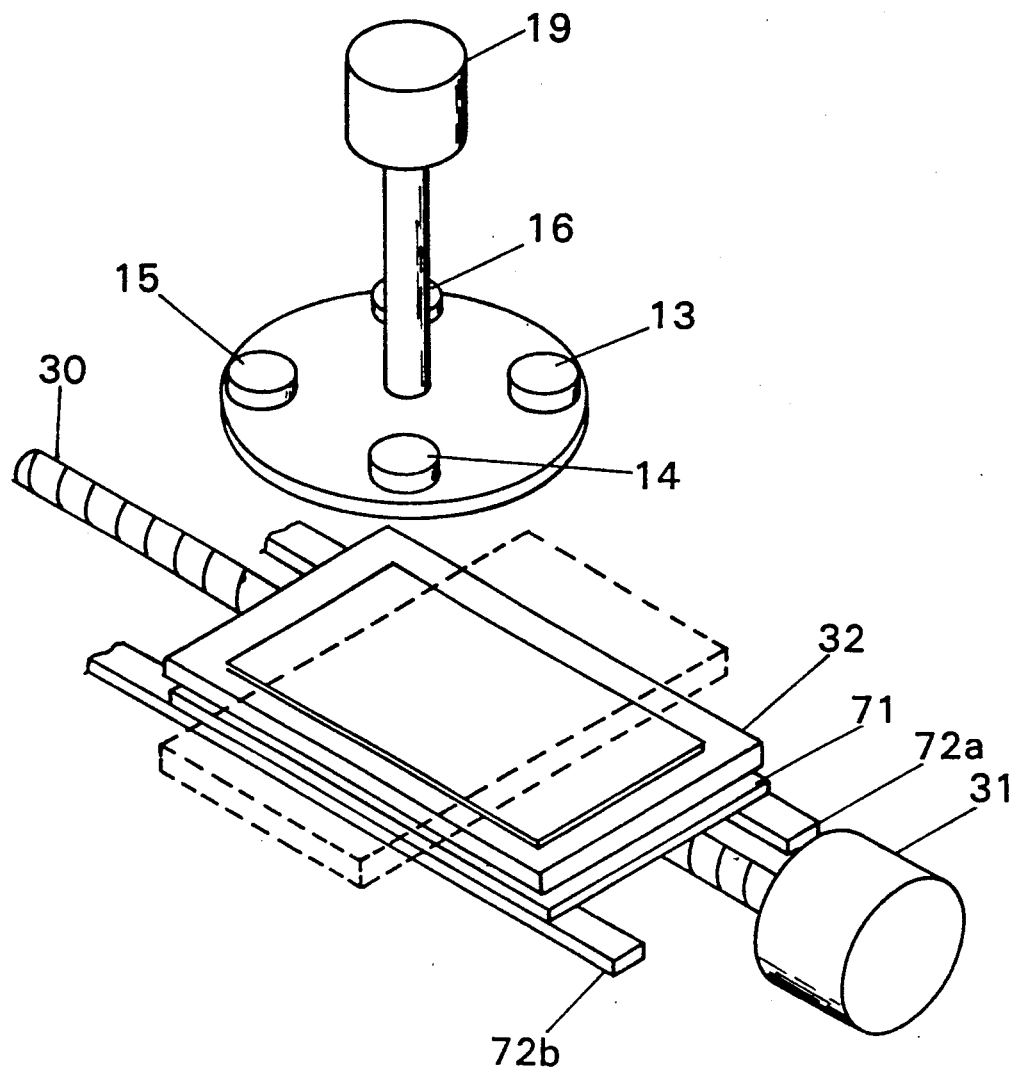
FIG. 7 is a perspective view showing another printed circuit board conveyer used in this invention.

FIG. 7 shows another printed circuit board table of this invention, which is constructed to give a rotation of 90 degrees to the printed circuit board, as desired, which is being conveyed in the longitudinal direction, so that the circuit board can be conveyed in the direction of its short side during the inspection by the inspection apparatus, thereby reducing the inspection period of time.

Figure 8:
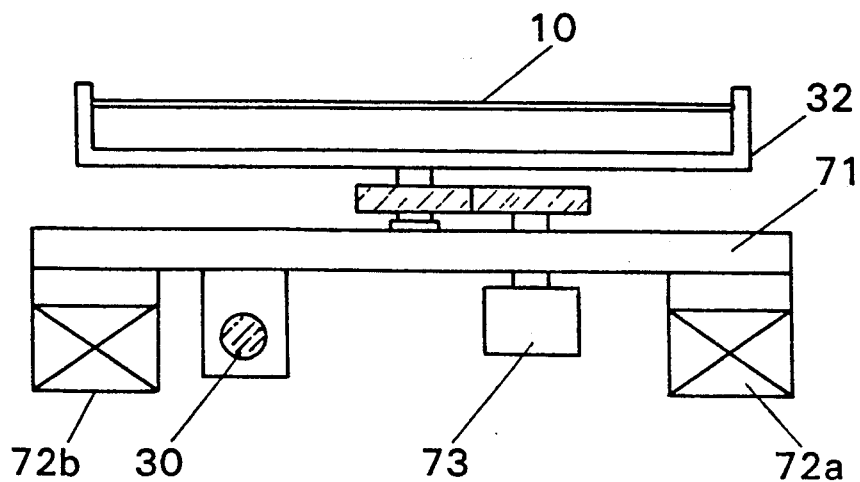
FIG. 8 is a side view showing the conveyer of FIG. 7.

As shown in FIGS. 7 and 8, a conveyance table 71 is supported in such a manner as to slide along a pair of guide rails 72a and 72b installed in a parallel manner, and moves in accordance with the rotation of the conveyance screw 30 that is rotated by the pulse motor 31. On the conveyance table 71, a printed circuit board table 32 is rotatably supported, and can be rotated by an actuator 73 reversibly by 90 degrees. When the conveyance table 71 is positioned at the 1st position which is the end of the conveyance screw 30, the printed circuit board 10 with components to be inspected is placed on the table 32 and is moved at high speed to the 2nd position which is near the measurement starting position where the table 32 is rotated by 90 degrees. When rectangular printed circuit boards are passed through a production line, they are generally moved along on their long sides. However, when the printed circuit board is scanned by a light beam while the printed circuit board conveyer is moving along the long side, it takes a longer time than scanning in the direction of the short side. Thus the inspection time can be reduced by scanning along the short side of the printed circuit board. The reduction of inspection time is highly efficient for printed circuit boards with a large ratio of lengthwise to crosswise lengths.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An inspection apparatus for inspecting printed circuit boards on which components have been mounted, comprising:
   a rotary object that rotates around its axis;
   a conveyance means that conveys said printed circuit board relative to said rotary object;
   a plurality of light sources mounted on the rotary object, said plurality of light sources being arranged in a circle with the same axis as that of said rotary object, said plurality of light sources radiating light beams at approximately right angles to said printed circuit board, so that said light beams scan said printed circuit board as said rotary object rotates around its axis; and
   a plurality of photoelectric converts mounted on the rotary object, said plurality of photo electric converts being radially arranged around each of said light beams on said rotary object for receiving the light beams reflected from said printed circuit board so as to generate detection outputs corresponding to the position where the light beams from said light sources are reflected on said printed circuit board, said detection outputs corresponding to the unevenness of the surface of said printed circuit board.

2. An inspection apparatus for inspecting printed circuit boards on which components have been mounted, comprising:
   a rotary object that rotates around its axis;
   a conveyance means that conveys said printed circuit board relative to said rotary object;
   a plurality of light sources mounted on the rotary object, said plurality of light sources being arranged in a circle with the same axis as that of said rotary object, said plurality of light sources radiating light beams at approximately right angles to said printed circuit board, so that said light beams scan said printed circuit board as said rotary object rotates around its axis; and
   a plurality of photoelectric converters mounted on the rotary object, said plurality of photoelectric converters being radially arranged around each of said light beams on said rotary object for receiving the light beams reflected from said printed circuit board so as to generate first detection outputs corresponding to the position where the light beams from said light beam generator are reflected on said printed circuit board and second detection outputs corresponding to the brightness of the position where the light beams are reflected on said printed circuit board, said first detection outputs corresponding to the unevenness of the surface of said printed circuit board and said detection outputs corresponding to the brightness of each point of the surface of said printed circuit board.

3. An inspection apparatus according to claim 1, wherein said light beam is focused at a height of about 1 mm above the standard position of the surface of said printed circuit board.

4. An inspection apparatus according to claim 2, wherein said light beam is focused at a height of about 1 mm above the standard position of the surface of said printed circuit board.

* * * * *